US008586860B2

(12) United States Patent
Nakata

(10) Patent No.: US 8,586,860 B2
(45) Date of Patent: *Nov. 19, 2013

(54) SEE-THROUGH TYPE SOLAR BATTERY MODULE

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 208 days.

This patent is subject to a terminal disclaimer.

(21) Appl. No.: 12/737,655

(22) PCT Filed: Aug. 8, 2008

(86) PCT No.: PCT/JP2008/002174
§ 371 (c)(1),
(2), (4) Date: Feb. 3, 2011

(87) PCT Pub. No.: WO2010/016099
PCT Pub. Date: Feb. 11, 2010

(65) Prior Publication Data
US 2011/0132436 A1 Jun. 9, 2011

(51) Int. Cl.
*H01L 31/042* (2006.01)
*H02N 6/00* (2006.01)

(52) U.S. Cl.
USPC ............ 136/251; 136/244; 136/249; 136/250

(58) Field of Classification Search
USPC .................................. 136/243–265
See application file for complete search history.

(56) References Cited

U.S. PATENT DOCUMENTS

| | | | |
|---|---|---|---|
| 3,134,906 A | | 5/1964 | Henker |
| 4,173,494 A | * | 11/1979 | Johnson et al. ............... 136/250 |
| 5,059,254 A | * | 10/1991 | Yaba et al. ..................... 136/251 |
| 5,616,185 A | * | 4/1997 | Kukulka ........................ 136/244 |
| 6,204,545 B1 | * | 3/2001 | Nakata ........................... 257/459 |
| 6,288,323 B1 | * | 9/2001 | Hayashi et al. ............... 136/244 |
| 6,635,507 B1 | * | 10/2003 | Boutros et al. ................ 438/57 |

(Continued)

FOREIGN PATENT DOCUMENTS

| | | |
|---|---|---|
| JP | 2007-073898 | 3/2007 |
| WO | WO-02/35612 | 5/2002 |
| WO | WO-03/036731 | 5/2003 |
| WO | WO-2007/144944 | 12/2007 |

OTHER PUBLICATIONS

Glassolutions. "Ceramic Printed Glass" Copyright 2005, pulled from Feb. 25, 2006. http://www.aisglass.com/bent_tempered.asp.*

*Primary Examiner* — Alicia Toscano
*Assistant Examiner* — Liesl C Baumann
(74) *Attorney, Agent, or Firm* — Jordan and Hamburg LLP

(57) ABSTRACT

A module includes optically transparent first and second substrates and a plurality of clusters, with each cluster including: a plurality of rod type solar cells; a conductive layer to which first electrodes of the plurality of solar cells are electrically connected in parallel; a conductive member to which second electrodes of the plurality of solar cells are electrically connected in parallel; a bypass diodes connected to the conductive layer and the conductive member; and a conductive connection member that electrically connects the conductive layer to conductive member of the cluster that is adjacent in a predetermined direction. By providing the plurality of clusters arranged in a hexagonal or rectilinear configuration, it is possible to enlarge the permitted scope for selection of the ratio between sunlight transmission ratio and electrical generation capability, so that it is possible to obtain enhanced freedom of design for use as a window material.

10 Claims, 12 Drawing Sheets

(56) References Cited

U.S. PATENT DOCUMENTS

| | | |
|---|---|---|
| 6,744,073 B1 | 6/2004 | Nakata |
| 7,238,878 B2 * | 7/2007 | Gonsiorawski ............... 136/246 |
| 7,602,035 B2 | 10/2009 | Nakata |
| 2005/0127379 A1 | 6/2005 | Nakata |
| 2009/0108285 A1 | 4/2009 | Nakata |
| 2012/0222724 A1 * | 9/2012 | Nakata .......................... 136/250 |

* cited by examiner

SEE-THROUGH TYPE SOLAR BATTERY MODULE

TECHNICAL FIELD

The present invention relates to a see-through type solar battery module, and in particular relates to a see-through type solar battery module in which a plurality of clusters are formed with each cluster including a plurality of rod shaped solar cells, these clusters are arranged in various patterns including a pattern such as a matrix having a plurality of rows and a plurality of columns, and these clusters are integrally installed to a pair of optically transparent substrates.

BACKGROUND TECHNOLOGY

In the prior art, various solar battery modules and solar battery panels have been implemented in practice that incorporate solar cells installed in a window material capable of transmitting sunlight. Generally, these are silicon type solar battery modules (or panels) that are made by laying flat plate shaped silicon solar cells that are manufactured from wafer shaped silicon crystals between two glass plates. Such a module is an adhered structure that is made by lining up the solar cells in a planar configuration with appropriate gaps being left between them and electrically connecting the cells by ribbon shaped conductors, and then by embedding them in the gap between the two glass plates using an EVA (ethylene vinyl acetate) resin.

Furthermore, there is a thin layer type of solar battery module in which are made from amorphous silicon and microcrystalline material. In order to manufacture such module as a window material, first, a transparent electrode layer of TCO ($SnO_2$) is formed on a glass substrate, and is separated into sections by laser light for making cell electrode portions. Next, a thin silicon layer, amorphous silicon (a-Si), and a thin silicon microcrystal layer are sequentially laminated thereupon, and this photoelectric layer is separated into sections at a constant pitch by laser light. Furthermore, a thin metallic layer is adhered over the entire area of the rear surface serve as an electrode, and, again with laser light, this metallic layer is separated into mutually insulated portions, so that a large number of small thin-layer solar cells are electrically connected in series at one time.

With these solar battery modules described above, only one side of the solar cells can serve as a light reception surface, and the electricity generation capability is low because the usable range of ambient light around the module is narrow. Furthermore, with a silicon type solar battery module, the see-through ratio (sunlight transmission ratio) become small due to the flat plate type solar cells which are large in size. Moreover, with a thin layer type solar battery module, the thin layers on the glass substrate is accompanied by many difficulties.

In Patent Document #1, there is disclosed a rod type solar cell in which a rod shaped crystal of small diameter is made in order to reduce the processing loss of semiconductor material, and, after this crystal has been cut into an appropriate length, there are manufactured a pn junction of partially cylindrical shape that is formed to a constant depth along the surface of the rod shaped semiconductor and a pair of small positive and negative ribbon shaped electrodes that are provided at the central portion of the surface of the rod shaped semiconductor so as to oppose one another on opposite sides of its center. But, since this cell is used by being fitted at the focal point of a mirror light condenser, its reception of light is limited to the light in front of the mirror. Furthermore, as in Patent Document #2, the present inventor has also proposed a rod type solar cell, on a portion of which a flat surface is formed. This rod type solar cell is made so as individually to receive all the incident light in 360° around an axis. Due to this, this rod type solar cell is compact and can be manufactured simply and also at a low price, as compared to the silicon type solar cell and the thin layer type solar cell described above.

Since in a module in which this rod type solar cell is installed the front surface of the cell is a cylindrical surface, which is different from the case of one to which a mirror light condenser is attached as in the case of Patent Document #1, it is possible to receive light over a range of almost 360° with respect to the central axis of the rod, and this advantage is very clear in an environment in which not only directly incident light is present, but also there is a lot of reflected light and scattered light. For example, if this cell is housed in a transparent package, then light that is reflected and scattered in the interior thereof can also contribute to generation of electricity, so that, if such a solar battery module is installed vertically in a building such as an office building or the like and also serves as a window, it is possible for it to also absorb reflected light from the ground surface or neighboring buildings or the like and generate electricity thereby. Moreover since the light reception surface is a cylindrical surface, although the angle of incidence for direct illumination from the sun changes according to the time of day, nevertheless it is still possible to anticipate comparatively stable electricity generation that does not depend on the direction of incidence, as compared with the planar type of solar cell or the type described in Patent Document #1.

Patent Document #1: U.S. Pat. No. 3,134,906.
Patent Document #2: International Publication WO 2007/144944.

DISCLOSURE OF THE INVENTION

Problems to be Solved by the Invention

However, since the solar cells of Patent Document #1 described above are fixed either horizontally or vertically to supports that have a light condensing function, and these supports are arranged at regular intervals, accordingly their light reception angle is restricted and it is quite difficult to install them to a window material, so that there is the problem that there is a lack of freedom in design. Furthermore, since the solar cells of Patent Document #2 described above are arranged linearly and moreover in a closely mutually contacted state, there is a problem in trying to enhance the freedom of design. For example, in the case of a window material in which the rod type solar battery module of the above described Patent Document #2 is installed, since the solar cells are arranged in a closely mutually contacted state, there are the problems that the freedom of design for appropriately setting the sunlight transmission ratio as a window material and the electrical generation capability as a solar battery module is narrow, that it is not possible to enhance the freedom of design because the field of vision is blocked by the solar cells, and so on.

Objects of the present invention are to provide a see-through type solar battery module that can enhance the freedom of design when used as a window material, and to provide a see-through type solar battery module that can increase the sunlight transmission ratio when used as a window material, and so on.

Means to Solve the Problem

The present invention presents a see-through type solar battery module for generating electricity with a plurality of rod type solar cells, and is characterized by comprising: an optically transparent first substrate; a plurality of rod type solar cells arranged with their conductive directions orthogonal to the first substrate and grouped into a plurality of clusters; a plurality of conductive layers formed on an inner surface of the first substrate so as to correspond to the plurality of clusters, with first electrodes of the plurality of solar cells of each cluster connected electrically in parallel thereto; a plurality of conductive members each of which is connected electrically in parallel to second electrodes of the plurality of solar cells of each cluster; a plurality of conductive connection members each of which electrically connects the conductive layer of each cluster to the conductive member of an adjacent cluster in a predetermined direction; a second optically transparent substrate disposed parallel to the first substrate with the plurality of solar cells sandwiched between them; and an optically transparent synthetic resin molding material that is charged between the first and second substrates and embeds the plurality of solar cells, the plurality of conductive members, and the plurality of conductive connection members therein.

Advantages of the Invention

According to the see-through type solar battery module of the present invention, since each of the plurality of clusters includes a plurality of the rod type cells, therefore each cluster can form the cell arrangement pattern freely. Due to this, it is possible to enhance the freedom of design for use as a window material. And, since a plurality of these clusters are provided and can be arranged, it is possible to impart a desired pattern of the arrangement to the solar battery module, so that it is possible further to enhance the freedom of design. Moreover it is possible to ensure good sunlight transmission even when the rod type solar cells are used in a window material, since they are extremely small.

In addition to the above described structure of the present invention, it would also be acceptable to employ, in addition, various structures such as the following.

(1) A positive terminal of the see-through type solar battery module may be provided at one end portion of the first substrate, and a negative terminal of the see-through type solar battery module may be provided at another end portion of the first substrate.

(2) Each of the solar cells may comprise: a p type or n type rod shaped semiconductor; a pn junction formed at a partially cylindrical surface layer portion of the rod shaped semiconductor; and a pair of ribbon shaped electrodes that are formed on opposite sides of an axis of the rod shaped semiconductor and are electrically connected to both sides of the pn junction.

(3) A plurality of bypass diodes may be provided corresponding to the plurality of clusters, each of which is connected to the conductive layer and the conductive member.

(4) The solar cells may have a bypass function of bypassing reverse current.

(5) The plurality of solar cells in each cluster may be arranged on six sides of a hexagon shape, and the plurality of clusters may be arranged in a matrix form having a plurality of rows and a plurality of columns.

(6) The plurality of solar cells grouped into plural clusters of each row or each column may be connected in series via the conductive connection members, and conductive layer bridges may be provided that electrically connect a plurality of conductive layers in each of the plurality of columns or each of the plurality of rows.

(7) The conductive connection member may include a elongated conductive member portion elongated from an end portion of the conductive member and a conductive connecting piece that is connected to an end portion of the elongated conductive member portion.

(8) The plurality of solar cells in each cluster may be arranged on one straight line.

(9) The first and second substrates may be made of a transparent glass plate, respectively.

(10) A proportion occupied in the entire area by a light transmission region in which sunlight is not intercepted by the conductive layers may be greater than or equal to 50%.

(11) A plurality of the see-through type solar battery modules may be arranged in a plurality of rows or in a plurality of columns by being fitted into an external surrounding frame made from metal.

(12) A ceramic layer, with added color and patterned, may be provided as a foundation for the plurality of conductive layers.

DESCRIPTION OF NUMERALS

Figure 1:
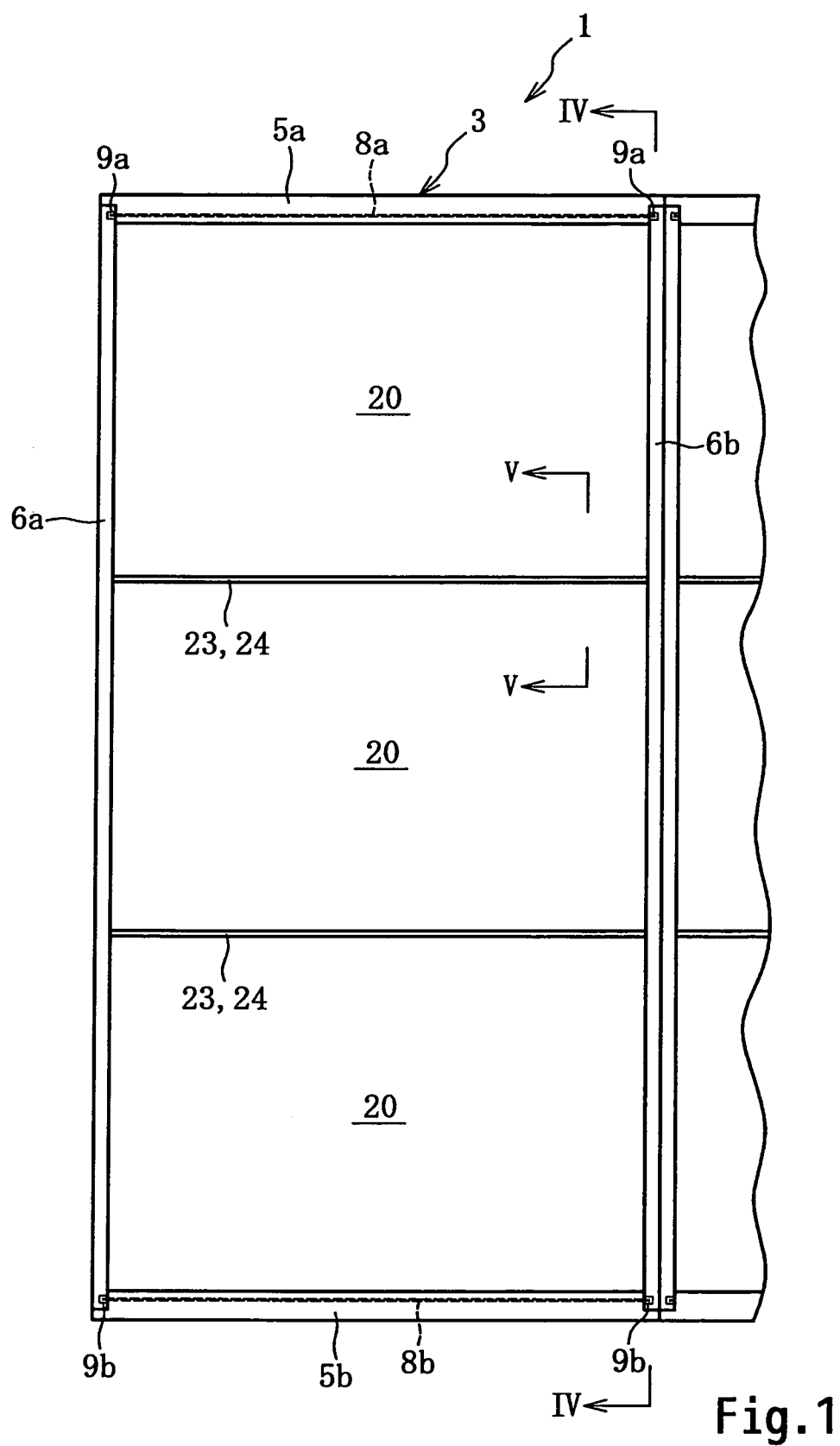
FIG. 1 is a rear view of a solar battery panel to which see-through type solar battery modules according to a first embodiment of the present invention are installed.
Figure 2:
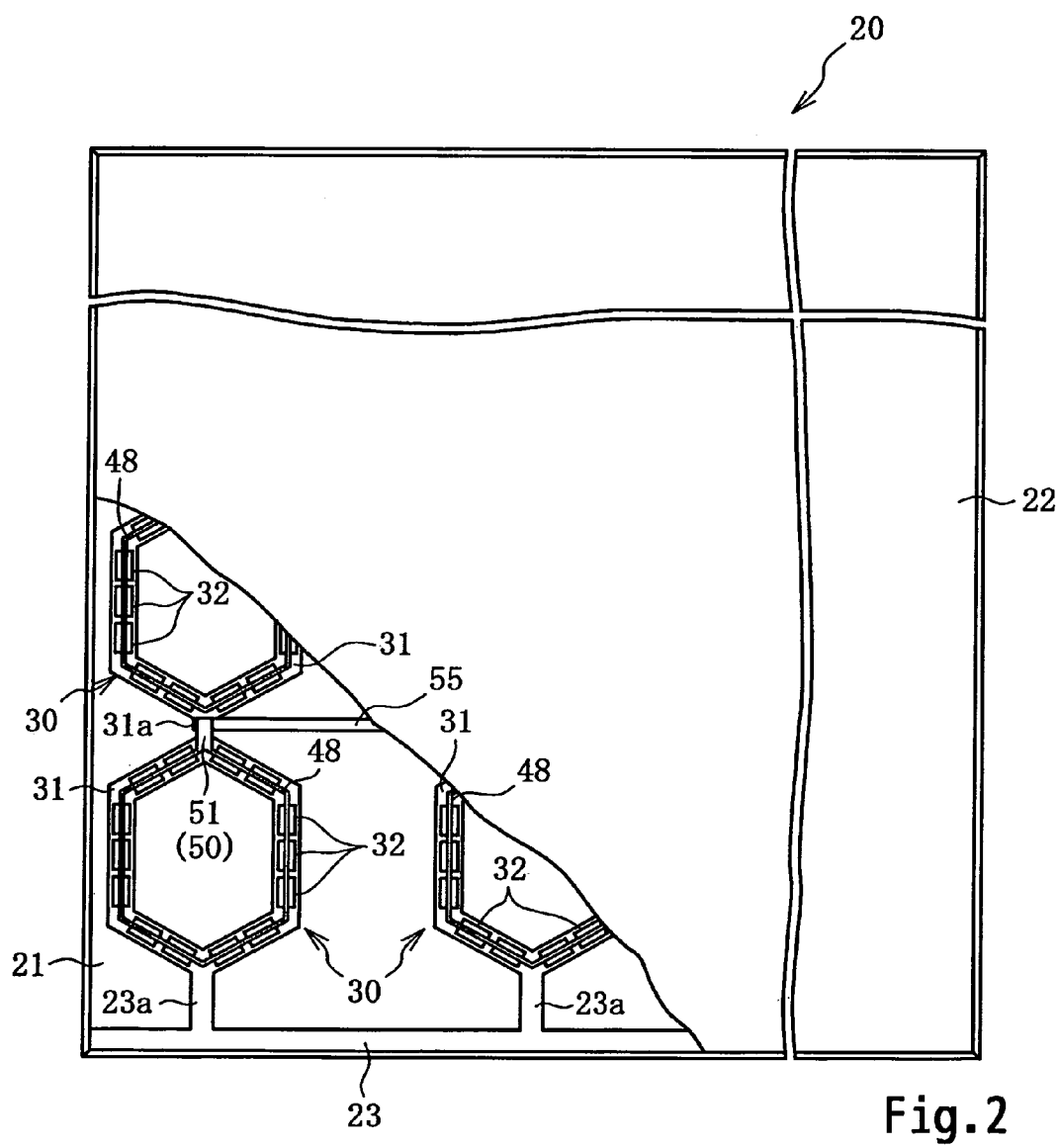
FIG. 2 is a partially cut away elevation view of the see-through type solar battery modules.
Figure 3:
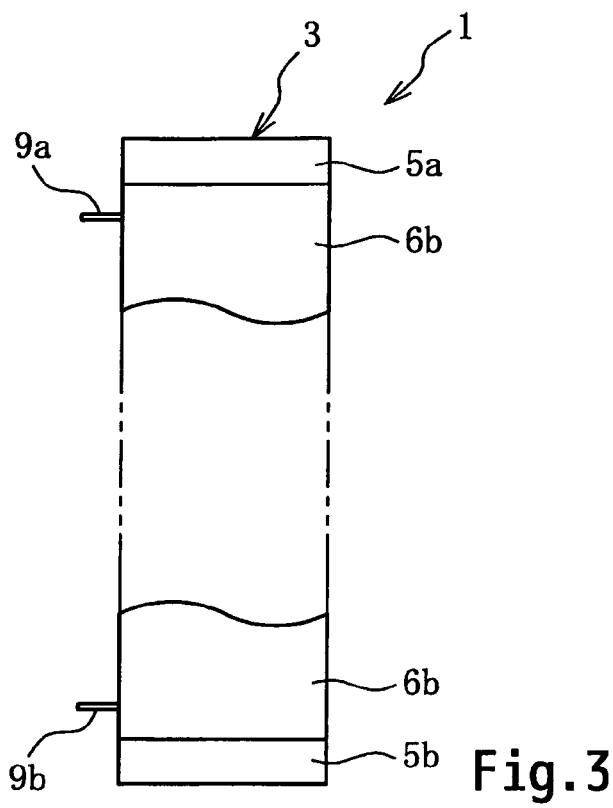
FIG. 3 is a side view of the solar battery panel.
Figure 4:
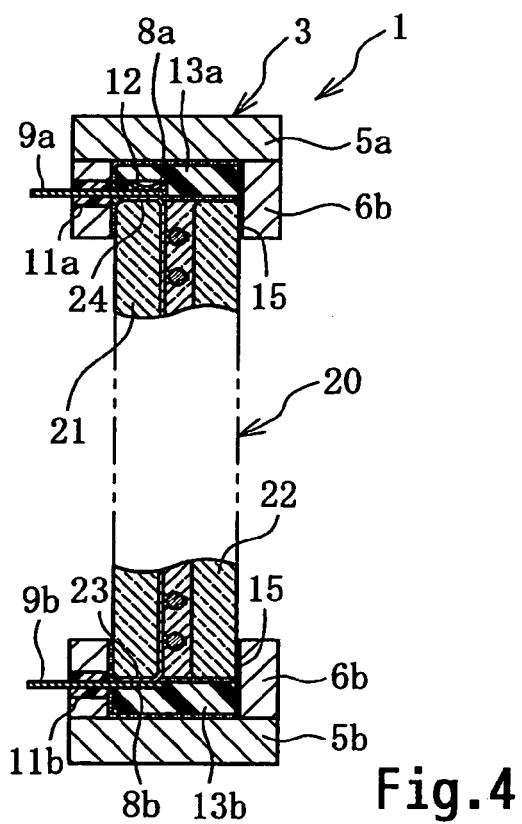
FIG. 4 is a sectional view at IV-IV line of FIG. 1.
Figure 5:
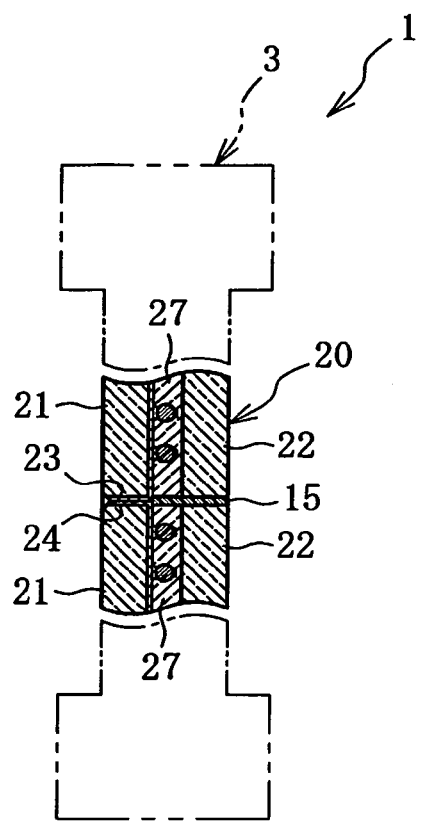
FIG. 5 is a sectional view at V-V line of FIG. 1.
Figure 6:
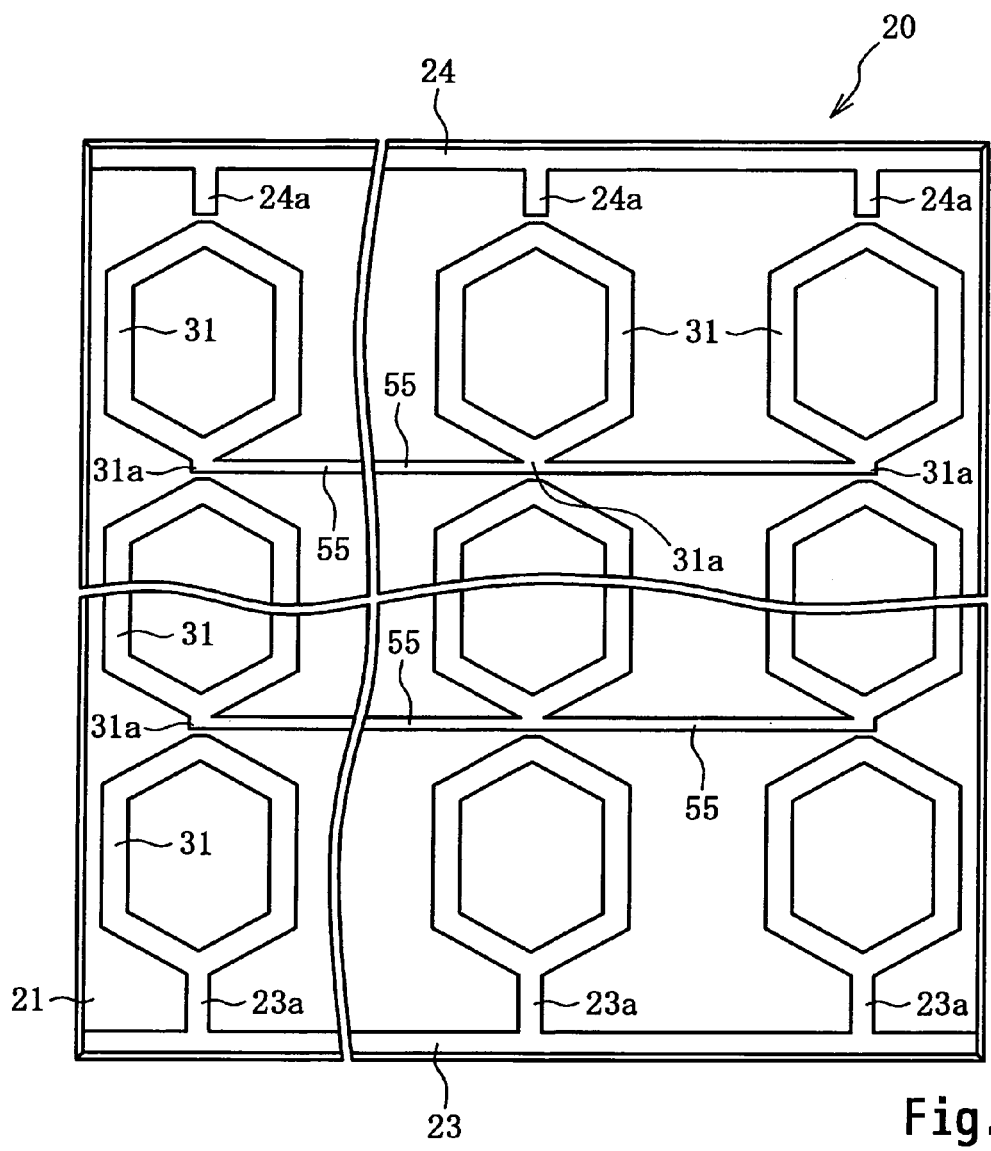
FIG. 6 is an elevation view of a first substrate on which conductive layers of a plurality of clusters are arranged.

1: solar battery panel
3: external surrounding frame
20, 20A: see-through type solar battery module
21: first substrate
22, 22A: second substrate
23: positive terminal
24: negative terminal
27: molding material
29, 29A: ceramic layer
30, 30A: cluster
31, 31A: conductive layer
32, 32A, 32B: rod type solar cell
33: rod shaped semiconductor layer
34: flat surface
35: diffused layer 36: pn junction
37: first electrode
38: second electrode
39: reflection prevention layer
40, 40A: bypass diode
48, 48A: conductive member
50, 50A: conductive connection member
51, 51A: elongated conductive surface layer portion
53, 53A: conductive connecting piece Best Mode for Implementing the Invention In the following, various preferred embodiments for implementation of the invention will be explained.
Embodiment 1
First, a solar battery panel 1 to which the present invention is applied will be explained. As shown in FIGS. 1 to 5, the solar battery panel 1 is made as a window material, and is constructed from an external surrounding frame 3 and three see-through type solar battery modules 20. The three see-through type solar battery modules 20 (hereinafter referred to as "modules") are oriented with their long sides horizontal, and are assembled into the external surrounding frame 3 so that they all lie in the same plane and are arranged in a matrix form having three rows and one column.

Sealing material (for example silicon resin) is charged into the gaps between the modules 20 and the external surrounding frame 3 and into the gaps between vertically adjacent modules, and this serves to prevent ingress of rain or harmful gases into the interior. It should be understood that it is not necessary for the number of the modules 20 to be limited to three; it would also be possible to change the size of the external surrounding frame 3, and to arrange the plurality of modules 20 in a plurality of rows and/or a plurality of columns and then to assemble them into the external surrounding frame.

As shown in FIGS. 1, 3 to 5, the external surrounding frame 3 is made from aluminum, and is made from a pair of upper and lower horizontal frame members 5a, 5b and a pair of left and right vertical frame members 6a, 6b. To the upper horizontal frame member 5a there are provided a conductive interior terminal 8a that extends along the longitudinal direction of the horizontal frame member 5a, a pair of left and right output terminals 9a that are connected to the two end portions of this interior terminal 8a, insulating members 11a that insulate these output terminals 9a from the external surrounding frame 3, leaf springs 12 that bias the interior terminal 8a downwards, and a backup member 13a that backs up the module 20 from above and moreover insulates the interior terminal 8a from the horizontal frame member 5a.

And to the lower horizontal frame member 5b, there are provided a conductive interior terminal 8b that extends along the longitudinal direction of the horizontal frame member 5b, a pair of left and right output terminals 9b that are connected to the two end portions of this interior terminal 8b, insulating members 11b that insulate these output terminals 9b from the external surrounding frame 3, and a backup member 13b that backs up the module 20 from below and moreover insulates the internal terminal 8b from the horizontal frame member 5b. It should be understood that the raw material from which the external surrounding frame 3 is made is not limited to being aluminum; various other metallic materials could be employed.

The upper and lower output terminals 9a, 9b are long and narrow thin plate shaped members made from metal, and their one end portions are integrally connected to left and right end portions of both of the interior terminals 8a, 8b, while their other end portions are projected outward from the external surrounding frame 3 towards the rear side of the panel 1. Along with the upper interior terminal 8a being pressed towards a negative terminal 24 of the upper module 20 by the leaf springs 12, a positive terminal 23 of the upper module 20 is pressed towards the negative terminal 24 of the intermediate module 20, and a positive terminal 23 of the intermediate module 20 is pressed towards a negative terminal 24 of the lower module 20, all these terminals thus being reliably electrically connected together. Moreover, by the positive terminal 23 of the lower module 20 being pressed towards the lower interior terminal 8b by the weight of the module 20 itself, a reliable electrical connection is established therebetween. The electrical connections between neighboring modules 20 are established by the upper positive terminal 23 of the upper module 20 being pressed by the weight of the upper module 20 into contact with the negative terminal 24 of the intermediate module 20, and by the positive terminal 23 of the intermediate module being also pressed into contact with the negative terminal 24 of the lower module 20.

Subsequently, only one of the see-through type solar battery modules 20 will be explained, although as mentioned above three modules 20 are provided, since these three modules 20 all have similar constructions.

As shown in FIGS. 6 to 12, this module 20 generates electricity with a plurality of rod type solar cells 32, and comprises an optically transparent first substrate 21, a plurality of hexagonal clusters 30 arranged on the first substrate 21 in a matrix form having a plurality of rows and a plurality of columns, an optically transparent second substrate 22 that is disposed parallel to the first substrate 21 with the plurality of solar cells 32 sandwiched between them, and an optically transparent synthetic resin molding material 27 that is charged between the substrates 21, 22 and is molded into a state in which the plurality of clusters 30 are embedded therein.

Next, the first substrate 21 and the second substrate 22 will be explained. The first substrate 21 is made of a transparent glass plate with the borders chamfered, and may, for example, be processed so that its thickness is 2.8 mm, its height is 210 mm, and its width is 297 mm. The positive terminal 23 (a positive side busbar) is provided at the lower edge portion of the first substrate 21, and has a reversed letter-L cross-sectional shape for external connection, and the negative terminal 24 (a negative side busbar) is provided at the upper edge portion of the first substrate 21, and has a letter-L cross-sectional shape for external connection (refer to FIG. 8). A plurality of positive side conductive layers 23a that continue from the plurality of conductive layers 31 are connected to the positive terminal 23, and a plurality of negative side conductive surface layers 24a are connected to the negative terminal 24.

And, similarly to the first substrate 21, the second substrate 22 is made of a transparent glass plate with the borders chamfered, and may, for example, be processed so that its thickness is 2.8 mm, its height is 210 mm, and its width is 297 mm. For the synthetic resin molding material 27 that is charged into the gap between the substrates 21, 22, for example, EVA (ethylene vinyl acetate) resin may be used.

Since the optically transparent synthetic resin molding material 27 is molded and solidified into a state in which the plurality of solar cells 32, a plurality of conductive layers 31, a plurality of bypass diodes 40, a plurality of conductive member 48, and a plurality of conductive connection members 50 all loaded between the substrates 21, 22 are embedded therein. Accordingly, it is possible to protect the solar cells 32 and also to strengthen them against vibration and mechanical shock, and moreover it is possible to prevent damage to the module 20 as a whole, so that the safety can be enhanced. Moreover, even if exceptionally the solar cell suffers damage, the broken shards are prevented from flying off or coming away as well as laminated glass which is normally used and wired glass.

Now the method for manufacturing this module 20 will be explained in a simple manner.

The plurality of clusters 30 are all arranged on the first substrate 21, and then the molding material 27 in sheet form is laid over the plurality of clusters 30, and the second substrate 22 is superimposed thereupon, with the whole being received in a laminator device of a per se known type. This laminator device has a vacuum chamber that is divided horizontally by an elastic membrane. A heater is provided underneath and applies heat to the workpiece via a plate. The workpiece with the second substrate 22 laid over it is placed on the heat application plate, and, while gas is exhausted from the spaces that are horizontally partitioned by the membrane, heat is applied to the molding material 27 to a temperature of around 150° C. so that it becomes melted.

Then, as air is admitted into only the evacuated vacuum chamber above the membrane, the substrates 21, 22 are pressurized from both their sides by the pressure of this admitted air, due to the membrane. And the molding material 27 (i.e. EVA resin) is cooled and solidifies while being held in this state. Due to this thermal melting and solidification the molding material 27, which was a milky white color, becomes transparent, and the plurality of clusters 30 are adhered between the substrates 21, 22, and are sandwiched on both sides by the glass plates so that an integrated module 20 is completed.

Next, the construction of the clusters 30 will be explained.

Since all of the plurality of clusters 30 have the same structure, only a single cluster 30 will be explained. As shown in FIGS. 2, 6 to 10, the cluster 30 is formed as hexagonal, and comprises a conductive layer 31 that is formed on the first substrate 21, 14 solar cells 32, a bypass diode 40, a conductive connecting member 50, and a conductive member 48 that electrically connects together these solar cells 32 and the bypass diode 40.

Next, the conductive layer 31 will be explained.

The conductive layer 31 is formed in a hexagon shape on the inner surface of the first substrate 21, and positive electrodes 37 of the 14 solar cells 32 and a negative electrode 45 of the bypass diode 40 are connected electrically thereto by electrically conductive paste 31b. The conductive layer 31 has a projecting portion 31a that is formed at the lower end of the conductive layer 31. To the projecting portion 31a, a conductive connecting piece 53 is provided for electrical connection to the neighboring cluster 30 underneath in the column direction, and a conductive layer bridge 55 is provided for electrical connection to the conductive layer 31 of the neighboring cluster in the row direction. The lowermost conductive layer 31 in each column is connected to the positive side conductive layer 23a. The plurality of solar cells 3 are disposed on the six sides of the hexagonal shaped conductive layer 31, with three of these solar cells 32 being arranged at regular intervals on the two long side portions on the left and right sides, while two of them are arranged on each of the remaining four short side portions. The bypass diode 40 is provided at the upper end square portion. It should be understood that the proportion of the total see-through area (light transmission area) in the entire area, in which transmitted sunlight is not intercepted by the conductive layers 31, is greater than or equal to 50%.

For the conductive layer 31, first, as the foundation for the conductive layer 31, a ceramic paste into which a pigment of a preferred color has been mixed is silk screen printed on the first substrate 21 and is fired, so that a ceramic layer 29 is formed. Next, a silver paste including glass frit is printed on the ceramic layer 29 by a silk screen process, and is fired at 550 to 620° C. so as to form the conductive layer 31. The width of this conductive layer 31 is approximately 2.4 mm, so that it is about 1.2 to 2.4 times larger than the diameter of the solar cells 32. It would be acceptable for the thickness to be formed to be about 0.25 mm, and, according to the conditions of use, the thickness may be in the range of from 0.01 mm to 0.5 mm. It should be understood that, simultaneously with the conductive layer 31, the positive side conductive layer 23a, the negative side conductive surface layer 24a, and the conductive layer bridge 55 that will be described later are also formed in a similar manner.

Next, the structure of the rod type solar cells 32 will be explained.

Figure 11:
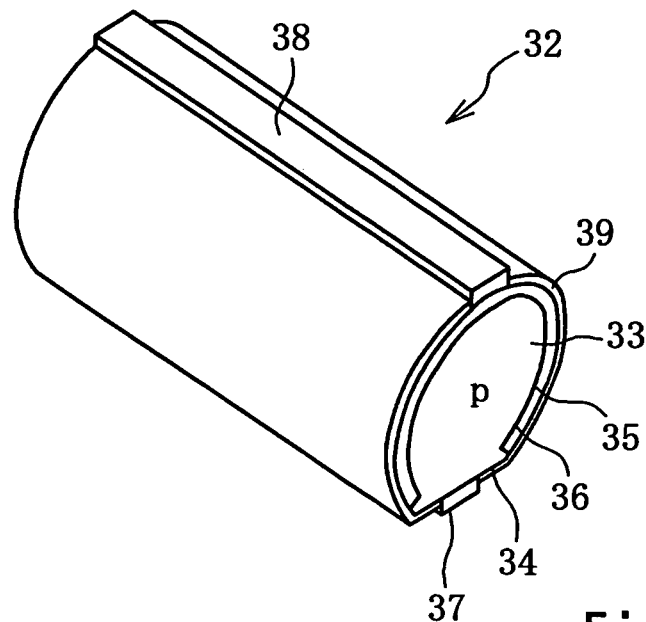
FIG. 11 is a perspective view of a rod type solar cell.
Figure 12:
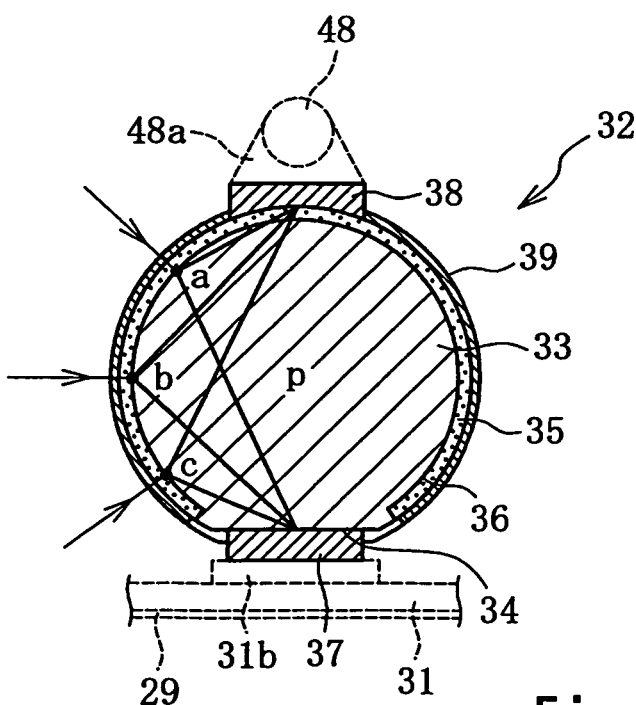
FIG. 12 is a sectional view of a rod type solar cell.

As shown in FIGS. 11, 12, a rod type solar cell 32 is mounted with its direction perpendicular to the first substrate 21, and comprises a rod shaped p type semiconductor 33, a flat surface 34 that is formed by grinding a portion of the front surface of the rod shaped semiconductor 33, a partially cylindrical shaped pn junction 36 that is defined by a n type diffused layer 35 being formed on a circumferential surface layer portion of the rod shaped semiconductor 33, a pair of ribbon shaped positive and negative electrodes 37, 38 (first and second electrodes) that are electrically connected to both ends (both sides) of the pn junction 36 and are formed so as to oppose one another with the axis of the rod shaped semiconductor 33 interposed between them, and a reflection prevention layer 39 that is formed on the entire surface except for the positive and negative electrodes 37, 38. This ribbon shaped positive electrode 37 is connected on the conductive layer 31 with conductive paste 31b, while the ribbon shaped negative electrode is connected to the conductive member 48 with conductive paste 48a.

The method for manufacture of this rod type solar cell 32 will now be explained in a simple manner.

This solar cell 32 is made by a technique of, for example, contacting a rod shaped p type single silicon crystal 33 of diameter 1 to 2 mm against a melt of silicon and pulling it upwards according to a per se known CZ method, so as to form a single silicon crystal of almost the same diameter. A ribbon shaped p type flat surface 34 is formed on a portion of the front surface of the p type single silicon crystal 33 having a length of 100 mm or greater. Then an n type diffused layer 35 is formed to a depth of around 0.1 μm from the surface by diffusing a n type impurity thereinto, with the exception of the flat surface 34 and its edges. By doing this, the partially cylindrical shaped pn junction 36 is formed.

Next, after forming, as a reflection prevention layer 39, a silicon oxide ($SiO_2$) layer (or, a layer of silicon nitride (SiN)) over the entire surface including the flat surface 34, a paste including silver is printed in the shape of a ribbon or band on the central portion of the flat surface 34 and on an apex portion of the cylindrical surface that is symmetrical thereto with respect to the axis of the rod, and heat is applied thereto in a gaseous atmosphere up to approximately 800° C. The silver paste pierces through the reflection prevention layer 39 and contacts against the p type flat surface 34 and the surface of the n type diffused layer 35 with low resistance, and thereby the positive electrode 37 and the negative electrode 38 are provided. Next, grooves of width 0.2 mm, and of depth around 0.1 mm are provided at a constant pitch of 5 mm in the axial direction by a chemical etching method, and, after washing in pure water, manufacturing of the rod type solar cell 32 is completed by cutting at positions of grooves perpendicularly to the axis of the rod with a dicer.

Since these rod type solar cells 32 are manufactured by making a single crystal whose diameter is close to that of these solar cells 32 and then cutting to the length for the solar cells 32, accordingly it is possible to prevent loss of the source material. And, since the light reception surface is a cylindrical surface, it is possible to obtain a symmetrical light reception sensitivity around the axial direction and to make the light reception range broader than that of a solar cell of a planar light reception type, while also being able to make the light reception surface area larger in the projected cross sectional area, which was restricted. It should be understood that it would also be acceptable to make a pn junction by forming a partially cylindrical shaped p type diffused layer on a rod type n type single silicon crystal.

According to this solar cell 32, since as shown in FIG. 12 the pn junction 36 is provided so as to have a partially cylindrical shaped surface, accordingly, with the exception of the flat surface 34 and the electrodes 37, 38, the cross sectional area for light reception is always constant irrespective of the angle of incidence of the sunlight, so that a stable output is obtained. Furthermore, since the electrodes 37, 38 are provided as centered on the p type and n type surfaces with the center of the rod interposed between them, accordingly the sum of the distances connecting from the electrodes 37, 38 to any points a, b, or c on the pn junction 36 is equal, so that the distances through which carriers generated by absorption at the points a, b, or c shift are equal, and the distribution of the flow of electrical current becomes almost equal and the curve fill factor becomes large. Moreover, since the range for light reception is three dimensional and the light other than direct incident light, in other words the reflected light and the diffused light, are both received simultaneously, accordingly the level of utilization of peripheral light is also high, so that high output is obtained.

Next, the bypass diode 40 will be explained.

Figure 10:
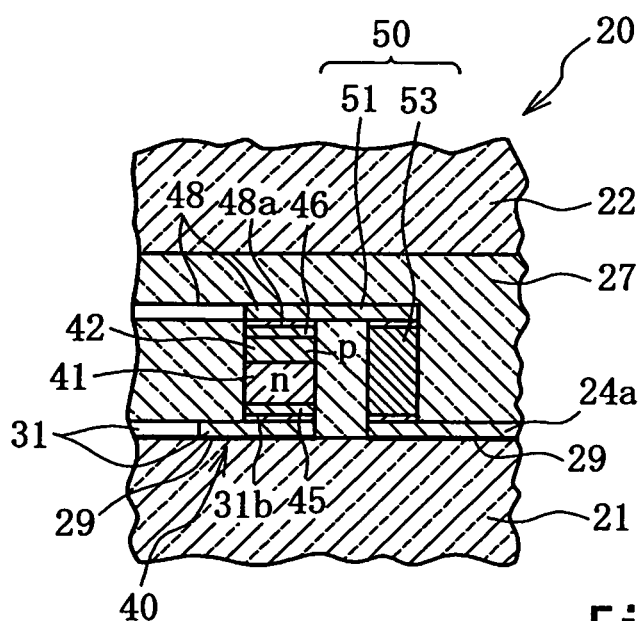
FIG. 10 is an enlarged view of essential portions of FIG. 8.

As shown in FIG. 10, the bypass diode 40 is fixed on a square portion at the upper end of the conductive layer 31 so that its conductive direction lies in the direction orthogonal to the first substrate 21, and is connected to the conductive layer 31 and the conductive member 48 in inverse parallel to the 14 solar cells 32. This bypass diode 40 is formed as a square prism, and is made by forming a pn junction 43 by diffusing a p type impurity into a semiconductor 41, thus making a p type diffused layer 42, and then contacting a negative electrode 45 against the surface of the n type semiconductor 41 and a positive electrode 46 against the surface of the p type diffused layer 42, both with low resistance. It should be understood that it would also be acceptable to make the bypass diode 40 as a circular cylinder.

Due to this bypass diode 40, if the 14 solar cells 32 within one cluster 30 that are all connected in inverse parallel with the diode 40 are shielded from light so that their functioning stops, even though voltage in the opposite direction originating in the solar cells 32 within the other clusters 30 that are functioning normally (i.e. to generate electricity) is applied to these solar cells 32 in this cluster 30 whose function has stopped, due to this bypass diode 40 bypassing the current, it is possible for the solar cells 32 that are connected in inverse parallel to be protected from destruction or damage, and it is possible to keep the decrease in the output of the entire module 20 due to the shielding from light of a portion including the cluster 30 down to a minimum.

Next, the conductive member 48 will be explained.

As shown in FIGS. 7 to 10, is a metallic wire made from copper alloy plated with silver and of diameter, for example, 0.3 mm, and the conductive member 48 is formed in a hexagon shape that corresponds to the conductive surface layer 31, and it is connected with conductive paste 48a to the negative electrodes 38 of the 14 solar cells 32 and to the positive electrode of the bypass diode 40. A elongated conductive member portion 51 that will be described later is connected to the upper end portion of the conductive member 48. Due to this conductive member 48 and the conductive layer 31, the 14 solar cells 32 are electrically connected in parallel, and the bypass diode 40 is electrically connected to the conductive layer 31 and the conductive member 48 in inverse parallel to the solar cell 32, whereby one of the hexagonal clusters 30 is formed.

Figure 7:
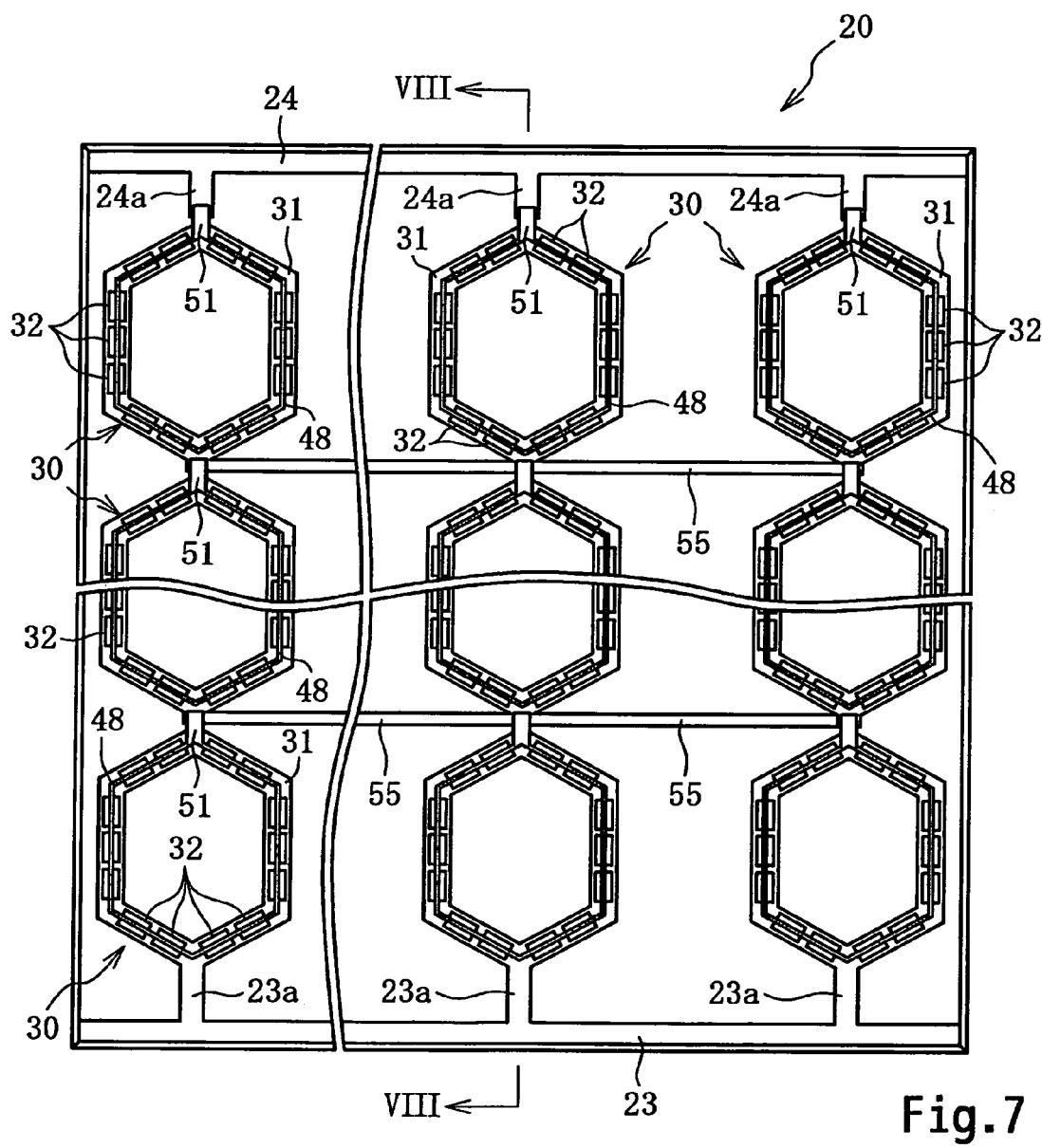
FIG. 7 is an elevation view of a first substrate on which a plurality of clusters in a matrix form having a plurality of rows and a plurality of columns are arranged and wired.
Figure 8:
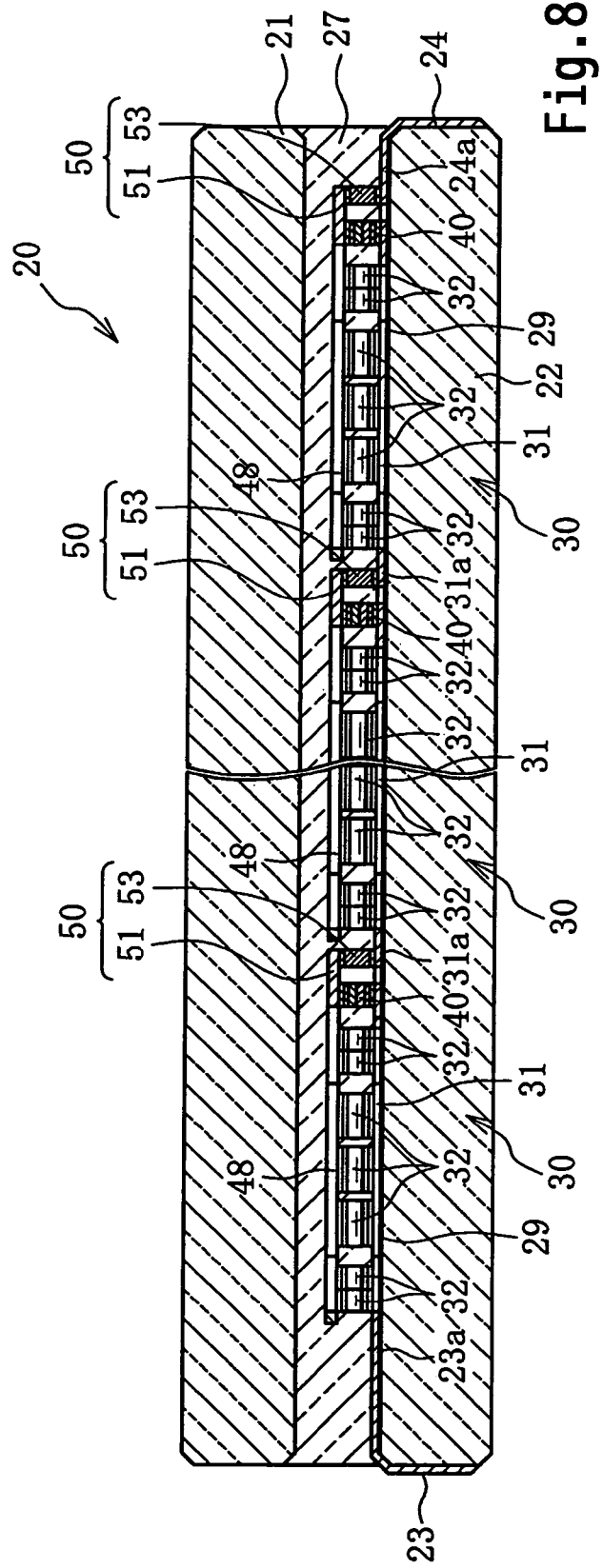
FIG. 8 is a vertical sectional view of FIG. 7.
Figure 9:
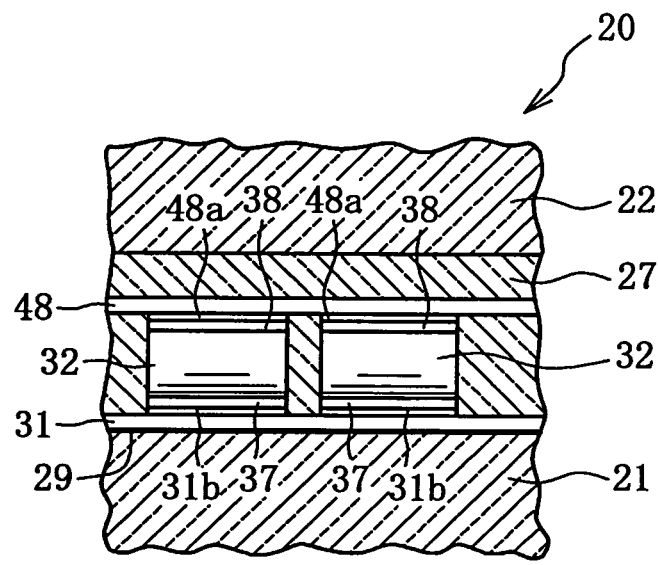
FIG. 9 is an enlarged view of essential portions of FIG. 8.

Next, a conducting construction by which the plurality of clusters 30 are electrically connected together will be explained. As shown in FIG. 7, the plurality of clusters 30 are laid out in a matrix form having a plurality of rows and a plurality of columns. The conductive layer 31 of each of the plurality of cluster 30 in each column is electrically connected to the conductive member 48 of the lower side adjacent cluster 30 via the conductive connection member 50. The plurality of conductive layers 31 in the plurality of clusters 30 in each row are connected in parallel by conductive layer bridges 55. In other words, among the plurality of clusters 30, the plurality of solar cells 32 of the plurality of cluster groups of each column are connected in series via the conductive connection members 50, and the plurality of solar cells 32 of the plurality of cluster groups of each row are connected in parallel via the conductive layer bridges 55.

The conductive connection member 50 includes a rectilinear elongated conductive layer portion 51 and the conductive connecting piece 53. This elongated conductive layer portion 51 is shaped as a thin plate made from metal, and its one end portion is electrically connected to the conductive member 48 while its other end portion is electrically connected to the conductive connecting piece 53 with conductive paste. The conductive connecting piece 53 is a square prism made from metal, and is electrically connected on the projecting portion 31a of the conductive layer 31 of the adjacent cluster 30 upwards in the column direction 30 with conductive paste 31b. And the uppermost conductive connecting piece 53 in each column is connected to the negative side conductive layer 24a. It should be understood that it would also be acceptable for the conductive connecting pieces 53 to be circular cylindrical metallic pieces.

The conductive layer bridges 55 are provided so as electrically to connect the plurality of conductive layers 31 of each row. These inter conductive layer bridges 55 are formed in straight lines between the projecting portions 31a of the clusters, and are made from silver paste, like the conductive layers 31. It should be understood that the conductive layer bridges 55 need not necessarily be rectilinear; it would be acceptable for them to be shaped as zigzags or as curved lines. The conductive layer 31 of the lowermost cluster 30 of each column is connected to the positive terminal 23 via a positive side conductive layer 23a, and the conductive member 48 of the uppermost cluster 30 is connected to the negative terminal 24 via a conductive connection member 50 and a negative side conductive layer 24a.

Since the plurality of clusters 30 are connected in series-parallel in this manner, even if some of the clusters 30 have stopped functioning, there is no stopping or decrease of the electricity generation effectiveness of those other clusters 30 that still remain normal, since electrical current still flows through the other clusters by detouring past those clusters 30 whose functioning has stopped, so that it is possible to reduce to a minimum the influence that is exerted to decrease the output of this entire module 20.

Next, the output of this module 20 will be explained.

Here, by way of example, the case will be explained of the output of a module in which are installed a plurality of clusters 30 that are arranged in a matrix form having three rows by three columns. If for example the open circuit voltage of one solar cell 32 is 0.6 V, then, since three clusters 30 are connected in series between the positive terminal 23 and the negative terminal 24, accordingly a voltage of 1.8 V is generated. And, if the current generated by one of the solar cells 32 of each cluster in each row is termed I, then, since three of the clusters 30 are connected in parallel, accordingly a current of 42×I flows out from the positive terminal 23.

In other words, with the solar battery panel 1 to which three of the modules 20 are assembled, a voltage of 5.4 V is generated, and a current of 42×I flows out from the output terminal 9b. It should be understood that it is possible to implement increase of the output voltage of the module 20 by increasing the number of clusters 30 that are connected in series, while, when the output current of the module 20 is to be increased, the number of clusters 30 connected in parallel should be increased. In the same way with the panel 1 as well, if the output voltage is to be increased, then this can be done by increasing the number of modules 20 that are connected in series; whereas, if the output current from the modules 20 is to be increased, then this can be done by increasing the number of modules 20 that are connected in parallel.

Next, the advantages obtained by this see-through type solar battery module 20 will be explained.

According to this module 20, it is possible for light that has been absorbed by the plurality of solar cells 32 to generate electricity, while light which has passed through between the plurality of solar cells 32 (transmitted sunlight) to light the indoors. The ratio of the amount of light that generates electricity to the amount of light that passes through for illumination depends on the projected area of all of the solar cells 3 installed on the first substrate 21. In other words, if it is desired to moderate strong sunlight, then the projected area of all of the solar cells 32 is increased according to the density at which the solar cells 32 are arranged, so that it is possible to increase the amount of electricity that is generated.

According to this module 20, since it is possible to set the pattern in which the plurality of clusters 30 are arranged freely, it is possible to provide the plurality of clusters 30 in patterns of various types, so that the freedom of design becomes high. Moreover, it is also possible to silk screen print a ceramic paste to which pigment of an appropriate color has been added on the surface of the first substrate as a foundation for the above described conductive layers 31, and then to fire this paste to form the ceramic layers 29, thus creating a beautiful and colorful pattern when seen from inside of the substrate 21 (i.e. from its indoor side). Furthermore, it is possible to make it difficult to see the solar cells 32 or the conductive layers 31 due to the ceramic layers 29. Because of this, it is possible to implement a module whose freedom of design when used as a building material or window material is high, quite apart from its function for optical electricity generation. Moreover, by forming the ceramic layers 29, along with enhancing the adherence to the conductive layers 31, it is also possible to enhance the strength of the glass substrate 21.

According to this module 20, not only are the hexagonal clusters 30 arranged in a matrix configuration that has a plurality of rows and a plurality of columns expressing a geometric design, but also it can be taken advantage of as a window material that can reconcile the needs for generation of electricity from sunlight and also for lighting (i.e. for transmission of sunlight), and the size of the hexagonal clusters 30 and the gaps between these clusters 30 can be designed in consideration of freedom of design, optical transmittivity, and photoelectric output.

According to this module 20, the wiring provided by the conductive layers 31 and the conductive connection members 50 and the conductive layer bridges 55 has an appropriate width capable of hiding the solar cells 32 as seen from the orthogonal direction to the conductive layer 31, and this is done in order for it to be possible to accentuate the pattern or design of the wiring, so that, along with making it possible to enhance the freedom of design as seen from the rear side of the module 20, it is also possible to increase the amount of the light incident from the front surface that is reflected and received by the solar cells 32, so that the output is enhanced.

According to this module 20, when the sizes of the plurality of solar cells 32 and of the plurality of conductive layers 31 are compared with those of a prior art flat plate type solar cell or a thin layer solar cell, since they are smaller and thinner and also can be arranged in a dispersed configuration, accordingly they do not themselves constitute any hindrance to their own wide field of view, and thus they can be utilized for manufacturing a see-through type solar battery module through which both interior views and exterior scenery can be viewed with uniform lighting (i.e. sunlight transmission) performance and no sense of discomfort.

According to this module 20, by embedding the plurality of solar cells 32 between the optically transparent substrates 21, 22, and by using this module 20 for a window material, it is possible to reduce the total costs in comparison with a case in which electricity is generated using an independent solar battery panel, in which costs are entailed by the cost of materials such as glass or the like, and also for installation. Moreover, since the components such as the plurality of rod type solar cells 32 and the plurality of conductive layers 31 are first arranged, and then the second substrate 22 is laid over them, accordingly it is not necessary to arrange any components on the second substrate 22, so that the assembly process is easy.

Embodiment 2

In this second embodiment, an example is disclosed of a see-through type solar battery module 20A in which the pattern of arrangement of the plurality of rod type solar cells in the plurality of clusters 30 of the first embodiment is changed; and only the structures different from those of the first embodiment will be explained.

Figure 13:
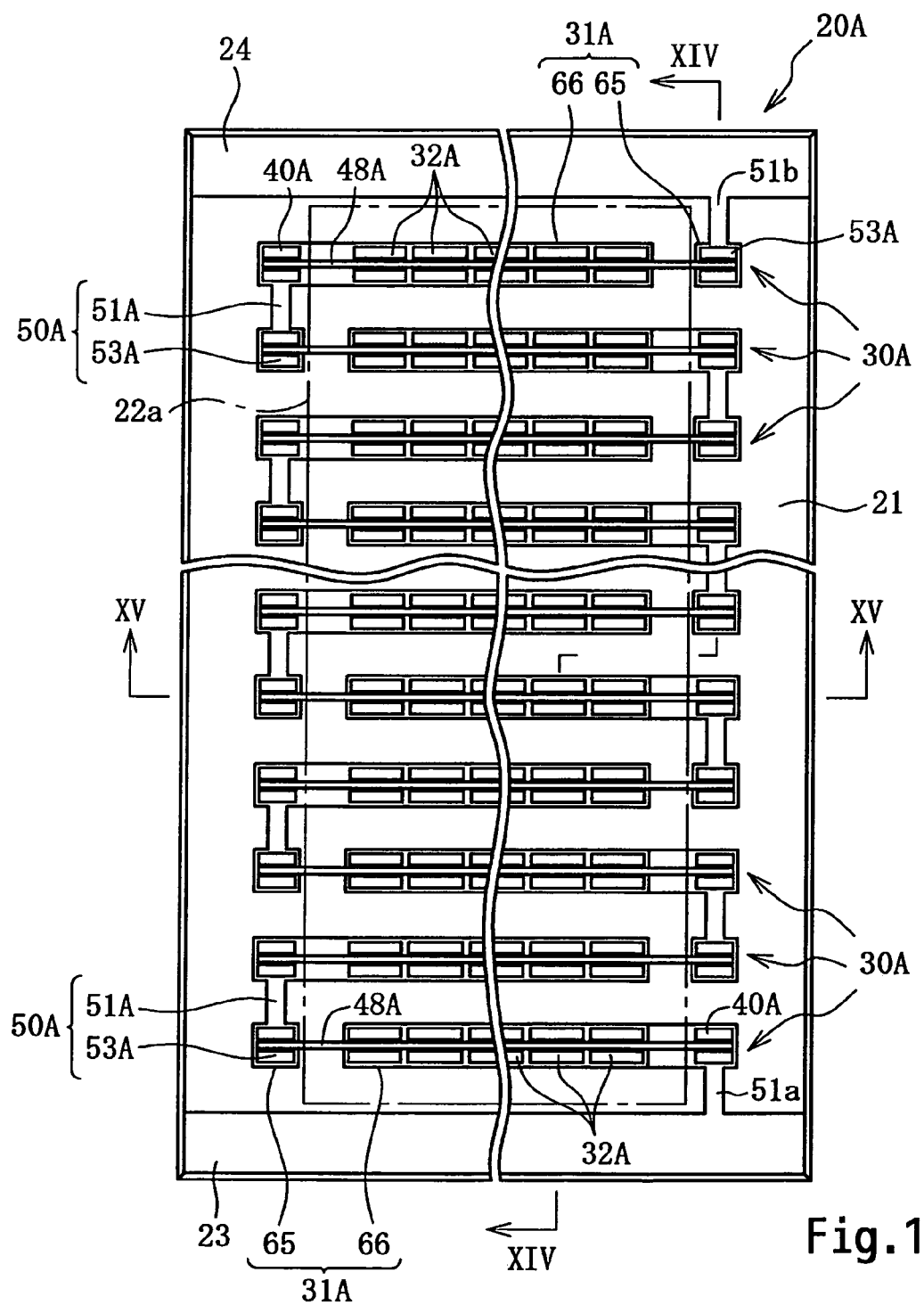
FIG. 13 is an elevation view of a first substrate of a solar battery module according to a second embodiment, on which a plurality of clusters are arranged in a single straight line and wired.
Figure 14:
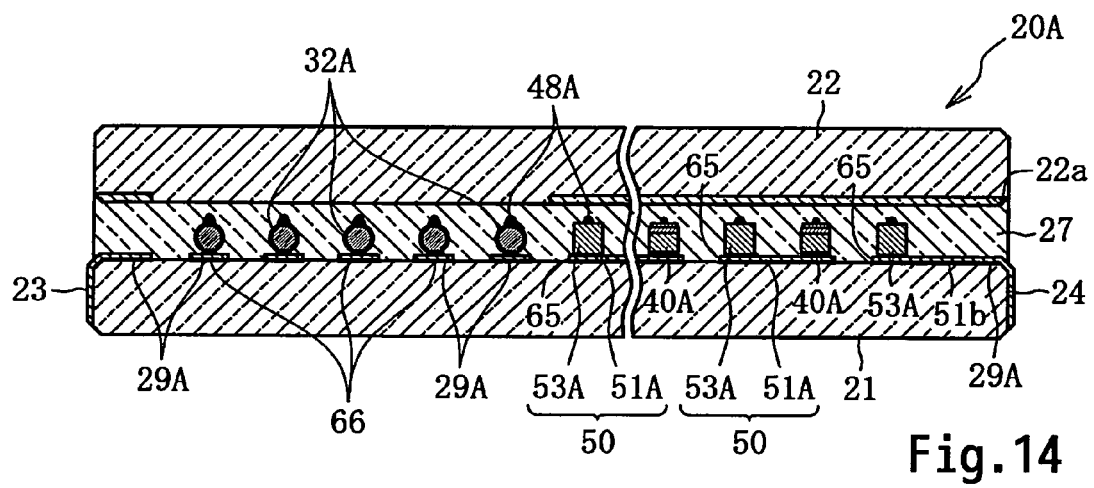
FIG. 14 is an sectional view at XIV-XIV line of FIG. 13.
Figure 15:
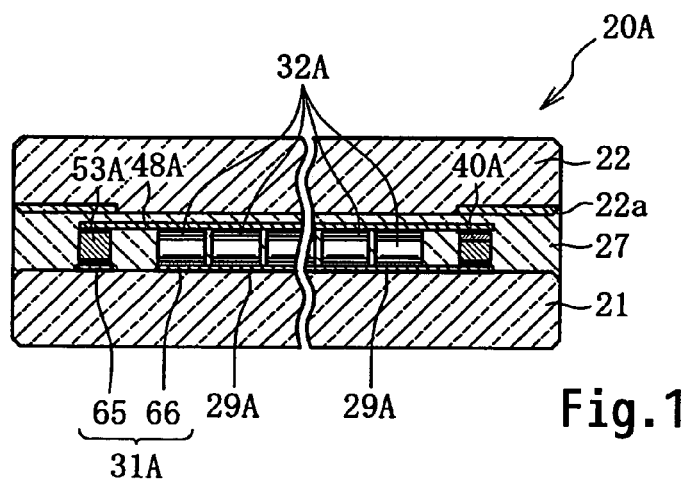
FIG. 15 is an sectional view at XV-XV line of FIG. 13.

As shown in FIGS. 13 to 15, these clusters 30A are formed as straight lines extending in the horizontal direction, and one of them consists of a conductive layer 31A formed on the inner surface of the first substrate 21, a plurality of rod type solar cells 32A, a bypass diode 40A, a conductive connecting piece 53A of the conductive connection member 50A, and a conductive member 48A that connects these solar cells 32A, the bypass diode 40A, and the conductive connecting piece 53A together.

The conductive surface layer 31A is a single straight line, and comprises a linear conductive layer 66 that has a width larger than the diameter of the solar cells 32, and a square shaped conductive layer 65 that is formed on the same line as the linear conductive surface layer 66 and is electrically isolated therefrom. The square shaped conductive layers 65 are formed integrally with the end portions of the elongated conductive layer portions 51A, with the exception of the uppermost and lowermost square shaped conductive surface layers 65. A plurality of conductive layers 31A are formed on the first substrate 21, mutually parallel and spaced apart at constant intervals along the vertical direction. It should be understood that the peripheral portion 22*a* of the inner side of the second substrate 22A is made as frosted glass by roughening its surface by a sandblasting process, and thus is put into a state in which the positive terminal 23 and the negative terminal 24, and the bypass diodes 40A and the conductive connecting pieces 53A, are hard to see from the front surface of the module 20A.

The plurality of solar cells 32A in each of the clusters 30A are arranged at regular intervals on the linear conductive layer 66, to which the positive electrodes 37 of solar cells 32A are connected. And the bypass diodes 40A are arranged on the outside portion of the linear conductive layers 66, to which the negative electrodes 45 of these bypass diodes 40A are electrically connected. The conductive connecting pieces 53A are arranged on and connected to the square shaped conductive layers 65. And the conductive member 48A is formed as a single straight line, and the negative electrodes 38 of the solar cells 32A and the positive electrodes 46 of the bypass diodes 40A and the conductive connecting pieces 53A are electrically connected together on this conductive member 48A.

Next, a conducting construction that electrically connects together the plurality of clusters 30A will be explained.

This plurality of clusters 30A are connected in series from top to bottom via the elongated conductive member portions 51A and the conductive connecting pieces 53A of the conductive connection members 50A. The square shaped conductive surface layer 65 of the uppermost cluster 30A is connected to the negative terminal 24 via an elongated conductive layer portion 51*b*, while the linear conductive layer 66 of the lowermost cluster 30A is connected to the positive terminal 23 via an elongated conductive layer portion 51*a*.

Next, the advantages of this module 20A will be explained.

With this module 20A, the conductive layers 31A that extend in single straight lines and to which the solar cells 32A are adhered so that the light can pass through are formed so as to be spaced at certain intervals, and accordingly it is possible to determine the sunlight transmission ratio during use as a window material, according to the area of the portion that light can pass through, other than these conductive surface layers 31A. The pattern created by the conductive layers 31A and the conductive members 48A, in which there is freedom of design, can be seen from the front surface or from the rear surface and moreover it can be utilized for a solar battery panel 1 that absorbs light from the exterior, including sunlight, with good efficiency and generates electricity. It should be understood that explanation of the other advantages of this embodiment is omitted, since they are the same as in the case of the first embodiment.

Embodiment 3

Figure 16:
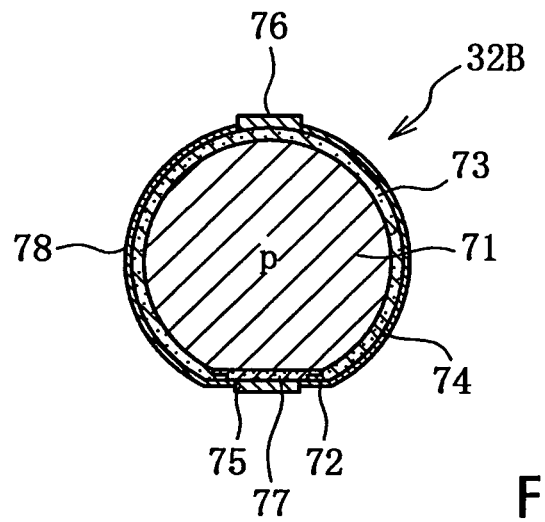
FIG. 16 is a sectional view of a solar cell according to a third embodiment.
Figure 17:
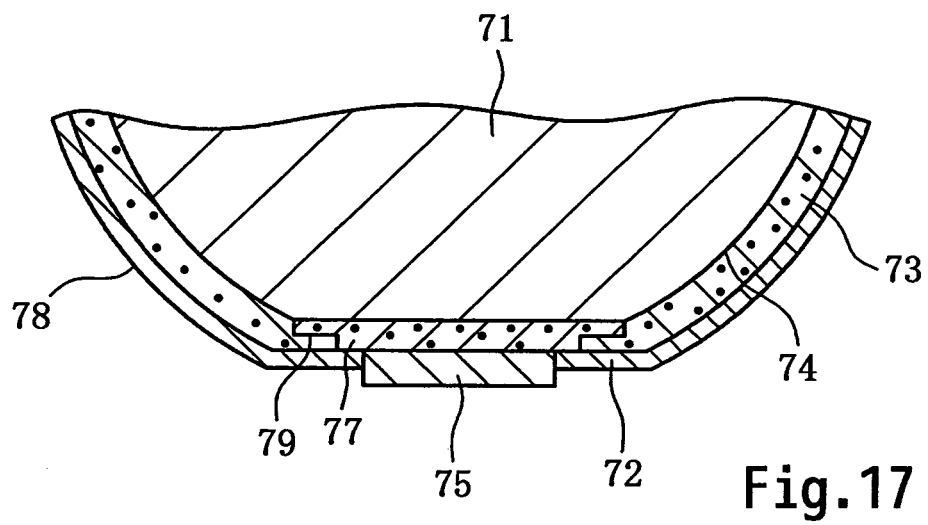
FIG. 17 is an enlarged sectional view of essential portions of a solar cell.
Figure 18:
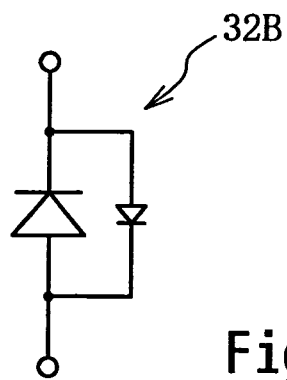
FIG. 18 is an equivalent circuit diagram of this solar cell.

In this third embodiment, instead of the rod type solar cells 32 and 32A of the first and second embodiment, solar cells 32B of this embodiment may be used. Moreover, in this case, it is possible to replace the bypass diodes with solar cells 32B. As shown in FIGS. 16 to 18, one of these solar cells 32B comprises a rod shaped p type single silicon crystal 71, a flat surface 72 formed at one end portion of the single silicon crystal 71, an $n^+$ diffused layer 73 formed on the surface portion of the single silicon crystal 71 with the exception of this flat surface 72, a ribbon shaped positive electrode 75 and a ribbon shaped negative electrode 76 that oppose one another with the axial center of the single silicon crystal 71 interposed between them, a $p^+$ diffused layer 77 that is formed on an outer surface portion of the flat surface 72 of the single silicon crystal 71 on its side towards the positive electrode 75, and a reflection prevention layer 78 that covers over the surface of the solar cell 32B, with the exception of its portions where the positive electrode 75 and the negative electrode 76 are provided.

A $pn^+$ junction 74 is formed at the partially cylindrical surface portion of the single silicon crystal 71, and this functions as a pn junction that is capable of generating photoelectromotive force; and this $pn^+$ junction 74 is formed as a cylindrical surface that is positioned at a substantially constant depth from the surface of the single silicon crystal 71, except for the flat surface 72. The pair of ribbon shaped electrodes 75, 76 are connected to both ends (both sides) of the $pn^+$ junction 74. And a $p^+n^+$ junction 79 that has a backward diode characteristic due to a tunnel effect is formed in two straight lines near the ribbon shaped positive electrode 75 on the portion towards the single silicon crystal 71 than the positive electrode 75. In other words, the equivalent circuit for this solar cell 32B is as shown in FIG. 18.

According to this module, even if some or all of the solar cells 32B of the clusters of one of the plurality of rows of clusters that are connected in parallel enter into a shadow so that reverse voltage is applied to these solar cells 32B, a bypass electrical current flows via the $p^+n^+$ junctions 79 of the solar cells 32B in this row (refer to FIG. 18). Accordingly, even if a shadow falls in any type of pattern on the module in which the plurality of clusters are electrically connected in a series-parallel circuit in a mesh pattern, there is no loss of generated electrical power, it becomes possible to take it out, and no bad influence is exerted on each of the solar cells. Furthermore, since no bypass diodes are provided, it is possible to increase the number of the solar cells, and thereby to enhance the output of the module.

Next, certain variant embodiments in which the above embodiment is somewhat altered will be explained.

[1] Since the proportion between the output electrical power of this module and its sunlight transmission ratio (or light shielding ratio) depends principally on the output electrical power of the plurality of solar cells that are used and the number thereof that are used, and on the total area shielded from the light by the plurality of conductive layers that are provided on the optically transparent first substrate, accordingly various designs are possible for the arrangement of the plurality of solar cells and the number thereof that are used, corresponding to the pattern or design of the conductive layers on the first substrate, in order further to enhance the high added value and the freedom of design for use as a window material.

[2] Apart from application in the above see-through type solar battery panel, this module can also be applied as a constructional material including a window material that it is desired to use, such as, for example, a glass window, an atrium, a top light, a curtain wall, a façade, a canopy, a louver, a double-skin outer surface, a balustrade for a balcony, a soundproofing wall for a high speed road or railroad, or the like.

Industrial Applicability

With this see-through type solar battery module, by providing the plurality of clusters that include the plurality of rod shaped solar cells, by configuring these clusters in hexagonal configurations or in straight lines, and by arranging the plurality of clusters, it is possible to enhance the permitted scope for selection of the ratio between the sunlight transmission ratio and the electrical generation capability, so that it is possible to obtain higher freedom of design in use as a window material etc.

The invention claimed is:

1. A see-through type solar battery module for generating electricity with a plurality of rod type solar cells each of which comprises a p type or n type rod shaped semiconductor, a pn junction formed at a partially cylindrical surface layer portion of the rod shaped semiconductor, and a pair of ribbon shaped first and second electrodes that are formed on opposite sides of an axis in a direction parallel to the pn junction of the rod shaped semiconductor and are electrically connected to both sides of the pn junction, comprising:

an optically transparent first substrate;

the plurality of rod type solar cells, wherein said rod type solar cells have a same configuration in which their axes, respectively, are parallel to the first substrate with their conductive directions orthogonal to the first substrate and grouped into a plurality of clusters having a same pattern of arrangement, with the plurality of clusters being arranged in a matrix form having a plurality of rows and a plurality of columns;

a plurality of conductive layers formed on an inner surface of the first Substrate, each one conductive layer of the plurality of conductive layers corresponding to one cluster of the plurality of clusters, wherein for each said one cluster the first electrodes of each one solar cell of the plurality of solar cells of said one cluster are connected electrically in parallel to said one conductive layer, respectively;

a plurality of conductive members corresponding said plurality of clusters, each one conductive member of the plurality of conductive member corresponding to said one cluster of the plurality of clusters, wherein for each said one cluster the second electrodes of said each one solar cell of the plurality of solar cells of said one cluster are connected electrically in parallel wherein the plurality of conductive layers further comprise a first conductive paste in direct physical contact with said plurality of conductive layers;

wherein the plurality of conductive members further comprise a second conductive paste in direct physical contact with said plurality of conductive members;

a plurality of bypass diodes corresponding to the plurality of clusters, each one bypass diode of the plurality of bypass diodes corresponding to said one cluster of the plurality of clusters, wherein for each said one cluster said each one bypass diode of the plurality of bypass diodes is electrically connected to and in direct physical contact with the first conductive paste of said one conductive layer and is electrically connected to and in direct physical contact with the second conductive paste of said one conductive member so that said one bypass diode is connected in inverse parallel to said each one solar cell of the plurality of solar cells of said one cluster;

a plurality of conductive connection members each of which electrically connect the conductive layer of said each one, cluster to the conductive member of an adjacent cluster in a predetermined direction;

a second optically transparent substrate disposed parallel to the first substrate with the plurality of solar cells sandwiched between them; and conductive member so that said one bypass diode is connected in inverse parallel to said each one solar cell of the plurality of solar cells of said one cluster;

an optically transparent synthetic resin molding material that is charged between the first and second substrates and embeds the plurality of solar cells, the plurality of conductive members, and the plurality of conductive connection members therein; and wherein a proportion occupied in an entire area by a light transmission region in which sunlight is not intercepted by the conductive layers is greater than or equal to 50 percent.

2. A see-through type solar battery module according to claim 1, wherein a positive terminal of the see-through type solar battery module is provided at one end portion of the first substrate, and a negative terminal of the see-through type solar battery module is provided at another end portion of the first substrate.

3. A see-through type solar battery module according to claim 1, wherein the solar cells have a bypass function of bypassing reverse current.

4. A see-through type solar battery module according to claim 1, Wherein the plurality of solar cells in each cluster are arranged on six sides of a hexagon shape, and the plurality of clusters are arranged in a matrix form having a plurality of rows and a plurality of columns.

5. A see-through type solar battery module according to claim 4, wherein the plurality of solar cells grouped into plural clusters of each row or of each column are connected in series via the conductive connection members, and conductive layer bridges are provided that electrically connect a plurality of conductive layers in each of the plurality of columns or each of the plurality of rows.

6. A see-through type solar battery' module according to claim 5, wherein the conductive connection member includes a elongated conductive member portion elongated from an end portion of the conductive member and a conductive connecting piece that is connected to an end portion of the elongated conductive member portion.

7. A see-through type solar battery module according to claim 1, wherein the plurality of solar cells in each cluster are arranged on one straight Line.

8. A see-through type solar battery module according to claim 1, wherein the first and second substrates are made of a transparent glass plate respectively.

9. A see-through type solar battery module according to claim 1, wherein a plurality of the see-through type solar battery modules are arranged in a plurality of rows or in a plurality of columns by being fitted into an external surrounding frame made from metal.

10. A see-through type solar battery module according to claim 1, wherein a ceramic layer, with added color and patterned, is provided as a foundation for the plurality of conductive layers.

* * * * *